(12) United States Patent
Baehr-Jones et al.

(10) Patent No.: US 10,666,016 B2
(45) Date of Patent: May 26, 2020

(54) TUNABLE LASERS

(71) Applicant: Elenion Technologies, LLC, New York, NY (US)

(72) Inventors: Thomas Wetteland Baehr-Jones, Arcadia, CA (US); Saeed Fathololoumi, San Gabriel, CA (US)

(73) Assignee: Elenion Technologies, LLC, New York, NY (US)

( * ) Notice: Subject to any disclaimer, the term of this patent is extended or adjusted under 35 U.S.C. 154(b) by 0 days.

(21) Appl. No.: 15/975,375

(22) Filed: May 9, 2018

(65) Prior Publication Data

US 2019/0348814 A1  Nov. 14, 2019

(51) Int. Cl.
| | |
|---|---|
| *H01S 5/14* | (2006.01) |
| *G02B 6/293* | (2006.01) |
| *H01S 5/10* | (2006.01) |
| *G02F 1/225* | (2006.01) |
| *H01S 5/00* | (2006.01) |
| *H01S 5/02* | (2006.01) |

(52) U.S. Cl.
CPC ............ *H01S 5/142* (2013.01); *G02B 6/2935* (2013.01); *G02F 1/2257* (2013.01); *H01S 5/0085* (2013.01); *H01S 5/021* (2013.01); *H01S 5/1028* (2013.01); *H01S 5/1071* (2013.01); *G02F 2203/70* (2013.01)

(58) Field of Classification Search
CPC ........ H01S 5/142; H01S 5/021; H01S 5/1028; H01S 5/0085; H01S 5/1071; H01S 5/4031; H01S 5/4025; H01S 5/4012; H01S 5/14; H01S 5/4062; H01S 5/06821; G02B 6/2935; G02B 2006/12109; G02B 2006/12159; G02B 2006/12121; G02F 1/2257; G02F 2203/70
See application file for complete search history.

(56) References Cited

U.S. PATENT DOCUMENTS

| | | | | |
|---|---|---|---|---|
| 6,330,254 | B1* | 12/2001 | Hung | H01S 3/005 372/20 |
| 2011/0305463 | A1* | 12/2011 | Mohamad | H04B 10/90 398/182 |
| 2012/0140783 | A1* | 6/2012 | Yeh | H01S 5/141 372/20 |
| 2015/0358083 | A1* | 12/2015 | Doerr | H04B 10/40 398/139 |
| 2016/0261352 | A1* | 9/2016 | Wen | H04B 10/532 |

\* cited by examiner

*Primary Examiner* — Xinning(Tom) Niu
(74) *Attorney, Agent, or Firm* — Stratford Managers Corporation

(57) ABSTRACT

Higher power tunable lasers are feasible using photonics integrated circuit based external cavity laser configurations by using multiple RSOAs inside a single cavity to provide multiple on-chip coherent optical output at the same wavelength. The total collective output power in various output branches potentially adds up being higher than what commercial lasers can provide. Using multiple RSOA increases and distributes the number of gain materials, which keeps them in a linear regime and avoids available gain saturation, which thereby removes gain saturation limitation in optical amplifications.

14 Claims, 7 Drawing Sheets

TUNABLE LASERS

TECHNICAL FIELD

The present invention relates to a tunable laser, and in particular to a higher power tunable laser for use in photonics integrated circuit devices.

BACKGROUND

Conventionally, getting sufficient power from an external cavity tunable laser may be difficult in a hybrid laser system, when the laser includes a bump bonding or edge coupling between a group III-V based reflective semiconductor optical amplifier (RSOA) and a laser cavity formed in a device layer of a photonic integrated circuit (PIC), e.g. silicon photonics (SiPh). The difficulty arises because at a given injection current the power is limited by: 1) coupling losses from the RSOA to the external cavity, 2) losses on the PIC, and 3) limited gain of the RSOA.

The first issue is a result of the hybrid integration of the laser onto the PIC, whereby the losses can be too high. The second issue is due to the optical power being too high in some areas of the laser, and hence excess losses are created that quickly limit optical power output and the wall plug efficiency of the laser. For example, higher power of the RSOA, and eventually higher power in PIC, can cause nonlinear losses in the PIC. Thirdly, it is difficult to achieve high optical gain from RSOAs in a silicon photonics (SiPh) platform. In order to increase RSOA gain, often the injection current to the RSOA is increased; however, the ultimate gain is limited by gain saturation at high currents. Gain saturation of the RSOA at high currents is due to limited available carrier concentration and over-heating. The gain saturation can cause wall plug efficiency of the laser device to drop.

An object of the present invention is to overcome the shortcomings of the prior art by providing a high power external cavity tunable laser with multiple RSOA's and multiple outputs.

SUMMARY OF THE INVENTION

Accordingly, the present invention relates to an external cavity laser device comprising:

a first gain medium for generating light;

a first reflector at one end of the first gain medium for reflecting light back through the first gain medium;

a second gain medium for generating light;

a second reflector at one end of the second gain medium for reflecting light back through the second gain medium; and a first coupler including a first input/output port optically coupled to the first gain medium, a second input/output port optically coupled to the second gain medium, and first and second output ports for outputting laser light at a selected wavelength range;

whereby light travelling from the first gain medium via the first input/output port is split into first and second portions by the first coupler, with the first portion passing to the second gain medium, and the second portion passing to the first output port as a first output beam, and whereby light travelling from the second gain medium via the second input/output port is split into third and fourth portions by the first coupler, with the third portion passing to the first gain medium, and the fourth portion passing to the second output port as a second output beam.

Another aspect of the present invention relates to an external cavity laser device comprising:

a first gain medium for generating light;

a first reflector at one end of the first gain medium for reflecting light back through the first gain medium;

a second gain medium for generating light;

a second reflector at one end of the second gain medium for reflecting light back through the second gain medium;

a first coupler including a first input/output port optically coupled to the first gain medium, a second input/output port optically coupled to the second gain medium, and a first output port for outputting laser light at a selected wavelength; and a second coupler including a first input/output port optically coupled to the second gain medium, a second input/output port optically coupled to the first gain medium via the second input/output port of the first coupler, and a second output port for outputting laser light at the selected wavelength;

whereby light travelling from the first gain medium via the first input/output port of the first coupler is split into first and second portions by the first coupler, with the first portion passing to the second gain medium, via the second coupler, and the second portion passing to the first output port as a first output beam, and whereby light travelling from the second gain medium via the second input/output port of the second coupler is split into third and fourth portions by the second coupler, with the third portion passing to the first gain medium, via the second input/output port of the first coupler, and the fourth portion passing to the second output port as a second output beam.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

In communication applications, frequently there is not necessarily a need for a single high power optical output port on a telecommunications chip, since the optical signal is destined to be separated into two or more sub-beams anyway. Instead, multiple optical taps, if they have a definite phase relation, may be used to provide input for an optical device, e.g. to multiple arms of a Mach-Zehnder modulator.

Accordingly, the laser cavity may be separated into multiple sections with multiple optical taps to lower the maximum optical output power circulating in the cavity in any one place, while still correctly providing aggregate optical input for multiple components involved in transmission.

Accordingly, for applications that require very high laser power, multiple RSOAs inside the gain cavity may be used, which would provide larger potential gain and hence higher output powers. Using multiple RSOAs in a single laser cavity may increase available gain inside the laser cavity as much as required.

Figure 1:
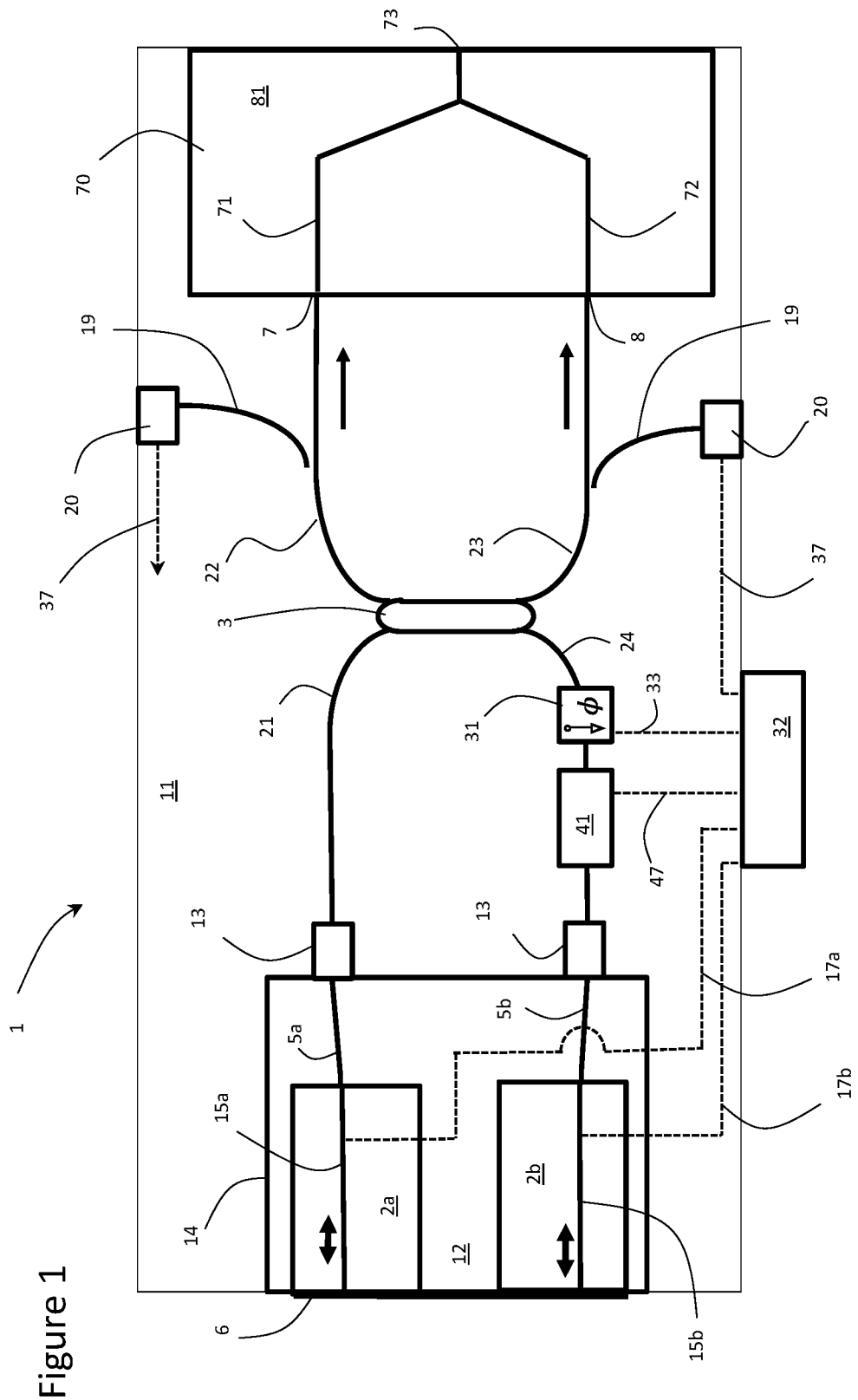
FIG. 1 is a schematic view of a laser in accordance with an embodiment of the present invention.
Figure 2:
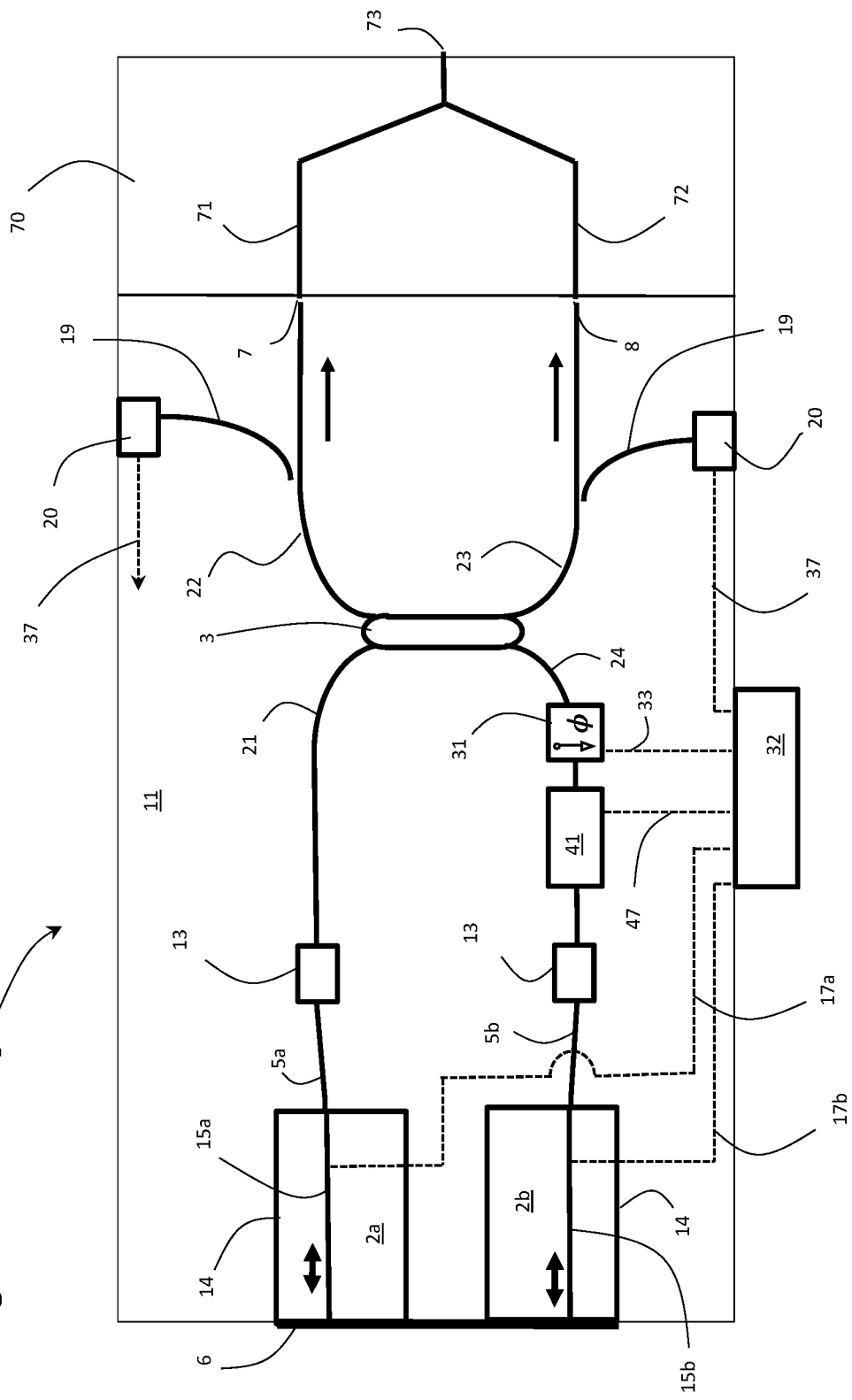
FIG. 2 is a schematic view of a laser in accordance with another embodiment of the present invention.
Figure 3:
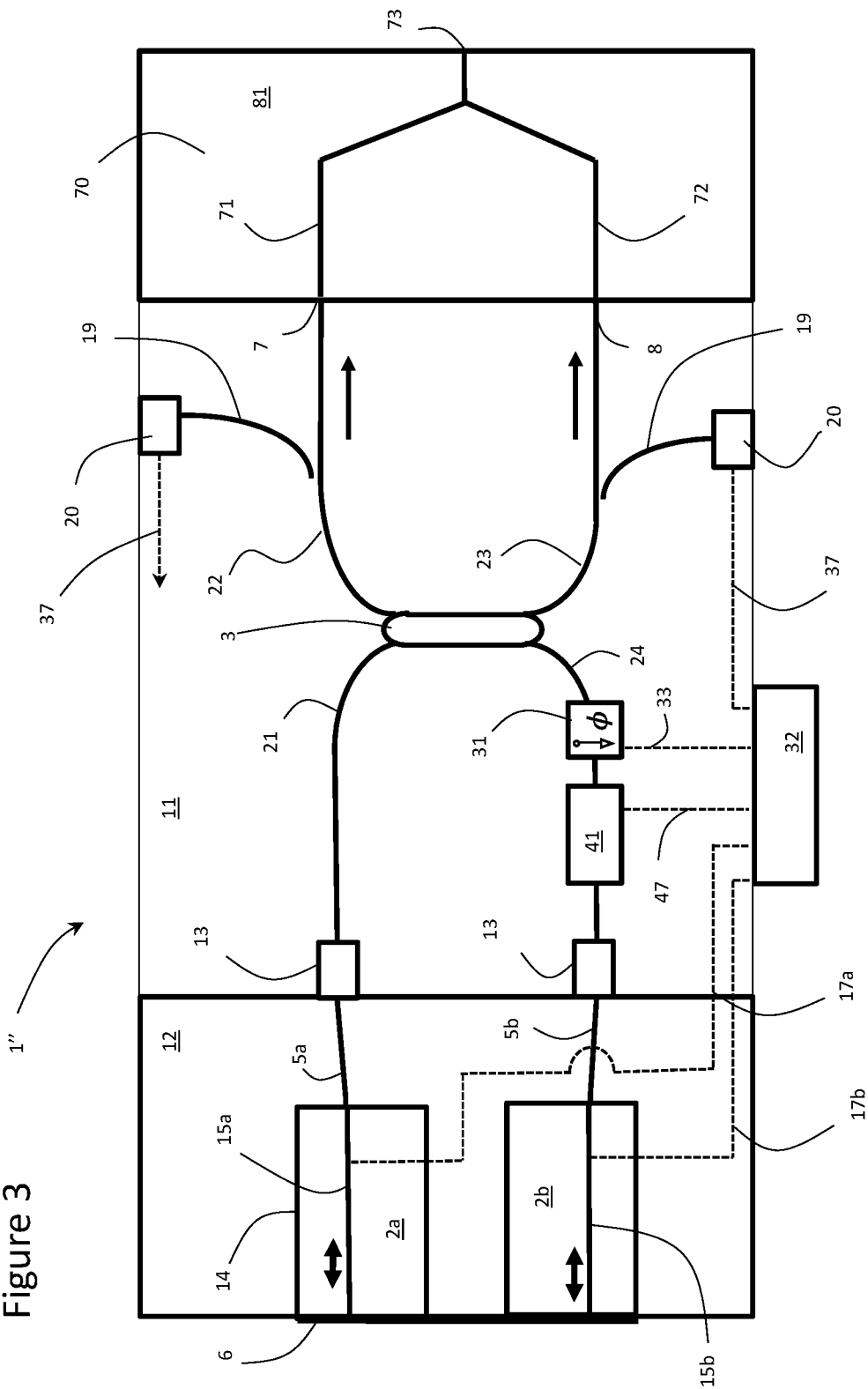
FIG. 3 is a schematic view of a laser in accordance with another embodiment of the present invention.

With reference to FIGS. 1, 2 and 3, a laser device 1, 1' and 1" according to an embodiment of the present includes a plurality of gain mediums, e.g. first and second gain mediums 2a and 2b, and a coupler system, e.g. a first coupler 3. One or more reflectors 6, e.g. a reflective surface, is provided on or adjacent to the first and second gain mediums 2a and 2b for reflecting light back to the coupler 3 forming a laser cavity therebetween for generating and amplifying light at desired wavelengths. First and second output ports 7 and 8 are provided for transmitting light from the laser device 1 provided on a photonic integrated circuit (PIC) chip 11.

The first and second gain mediums 2a and 2b may comprise any suitable amplification material, e.g. a suitable group III-V gain material, such as InP, GaAs and GaN based materials, in particular a reflective semiconductor optical amplifier (RSOA), which may be based on bulk, quantum well or quantum dot material. The first and second gain mediums 2a and 2b may be provided on the photonic integrated chip 11, as illustrated in FIGS. 1 and 2, or the first and second gain mediums 2a and 2b may be provided on one or more separate gain chips 12, optically coupled to the photonic chip 11, with the remaining elements, e.g. the coupler 3, provided on the photonic chip 11, as illustrated in FIG. 3. Each of the gain medium chips 12, e.g. a RSOA, may also be placed, e.g. flip-chip bonded, onto the photonic integrated chip 11, as illustrated in FIG. 1, or the gain mediums 2 may be grown onto the photonic integrated chip 11 to form the laser 1' defined in the device layer formed thereon, as illustrated in FIG. 2.

The photonic integrated chip 11 may include a separate substrate with a semiconductor, e.g. silicon, device layer formed thereon, which includes the coupler 3 and all connecting waveguides. Ideally the photonic integrated chip 11 comprises a silicon on insulator (SOI) structure including an upper silicon device layer, a middle silicon dioxide cladding layer, and a bottom silicon substrate. The advantage of this arrangement is that electrical controls on the photonic integrated chip 11 may control the properties of the laser 1, e.g. wavelength and power.

When the gain mediums 2a and 2b are embedded within the semiconductor photonic integrated chip 11, as in FIGS. 1 and 2, the connecting waveguides 5a and 5b, respectively, may be defined in either the photonic chip, e.g. SOI, material (See FIG. 2) or the gain medium material (e.g. InP) (See FIG. 1). During fabrication, a pit 14 may be etched from the device layer down to the substrate for each or both gain mediums 2a and 2b, followed by epitaxial growth of the gain mediums 2 (FIG. 2) or placement of the gain medium chip 12 within the pit 14 (FIG. 1). The cladding (oxide) layer may be removed from the photonic integrated chip 11 in order to improve the thermal conductivity between the gain mediums 2a and 2b and the substrate, and to match the height of the gain mediums 2a and 2b with the semiconductor device layer. The gain mediums 2a and 2b or the gain medium chip 12 may be bonded to electrical contacts (metal or doped semiconductor), which are connected to metal terminals for connecting with external control and/or power, as hereinafter described. Each gain medium 2a and 2b includes a waveguide channel 15a and 15b, respectively, for guiding the light therein.

The first optical coupler 3 may include a first port or branch 21 on one side optically coupled to the first gain medium 2a; a second port or branch 22 on the one side optically coupled to the first output port 7; a third port or branch 23 on an opposite side optically coupled to the second output port 8; and a fourth port or branch 24 on the opposite side optically coupled to the second gain medium 2b. The second and third ports or branches 22 and 23 may be optically coupled to additional optical elements in the device layer of the photonic integrated chip 11 and/or to an edge of the photonic integrated chip 11. The terms optically coupled or coupled are intended to mean connected for the sake of transmitting light therebetween, typically directly connected or utilizing some form of waveguide structure, e.g. integrated waveguides in the device layer, with or without other intermediate optical elements therebetween. The optical coupler 3, e.g. a 2×2 directional 3 dB coupler (DC), may be connected to the gain mediums 2a and 2b in order to split the laser light exiting the gain mediums 2a and 2b into two sub-beams, one sub-beam including a first percentage, e.g. 40%-60%, ideally 50%, of the power directed to the other gain medium 2a or 2b, and a second sub-beam including a second percentage, e.g. 40%-60%, ideally, 50% (or −3 dB) directed to the output port 7 or 8. The coupling ratio may be optimized to trade for coupling losses in the device layer and amplification imbalances in the two gain mediums 2a and 2b. Accordingly, during operation light travelling from the first gain medium 2a is split by the coupler 3, and a first portion travels via the fourth branch 24 to the second gain medium 2b, and a second portion travels via the third branch 23 to the second output port 8 forming a first output beam. Similarly, light travelling from the second gain medium 2b is split by the coupler 3, and a first portion travels via the first branch 21 to the first gain medium 2a, and a second portion travels via the second branch 22 to the first output port 7 forming a second output beam. For the sake of simplicity, the term "beam" or "sub-beam" may refer to a propagating signal within a waveguide or fiber.

One or more I/O waveguides 5a and 5b, from the gain mediums 2a and 2b may be angled at a small acute angle to a normal from the output facet of the gain medium 2a and 2b, e.g. by 5° to 15°, ideally by 9°, and include an anti-reflection coating to reduce the back reflection at the output facet.

The reflectors 6 may be comprised of one or more reflective surfaces on the RSOAs, one or more reflective surfaces or coatings in the pit 14 housing the gain medium 2, or on one or more surfaces or coatings of the photonic chip 11 or the gain medium chip 12, such as an outer edge of the photonic chip 11, as illustrated in FIG. 1. The reflector 6 may also comprise an alternate optical reflector, e.g. a grating, ring resonator, or some other wavelength filter element integrated into the photonic chip 11, the gain medium 12 or a separate reflector chip (not shown). Any combination of photonic chip 11, gain medium 2/gain chip 12 arrangement, and reflective surface 6 arrangement is within the scope of the invention.

An optical mode coupler 13 may be provided for coupling the light between the gain mediums 2a and 2b, in particular from the gain medium chip 12, and the device layer on the photonic chip 11. Due to the large mode mismatch between the I/O waveguides 5a and 5b (or the waveguide channels 15a and 15b) from the gain medium 2 and the waveguides in the device layer of the photonic chip 11, the optical mode coupler 13 may comprise an optical spot-size converter (SSC), which may be provided in the device layer of the photonic chip 11 to reduce the coupling loss between the gain mediums 2a and 2b and the photonic chip 11. Alternatively or in addition, the I/O waveguides 5a and 5b may include a tapering width and or height for expanding the mode reentering the gain mediums 2a and 2b and for contracting the mode leaving the gain medium chip 12.

One of more phase shifters or phase tuning sections 31 may be provided in or between the optical coupler 3 and the gain mediums 2a and 2b, coupled to one or both branches 21 and 24. Each phase tuning section 31 may comprise any form of suitable phase tuning device, e.g. thermo-optic, electro-optic etc. The phase tuning section 31 may be controlled by an external controller 32, via control line 33, to control, e.g. the index of refraction or the effective optical length of the waveguide, i.e. the relative phase of the first and second output beams, to ensure the first and second output beams have the same phase or at least a constant, predetermined or desired relative phase. The phase tuner, i.e. the phase tuning, may be provided by alternative means, e.g. in the coupler 3 or in the gain medium 2 or gain chip 12.

To ensure the amplitude of each of the output beams is substantially the same or at a desired level relative to each other when combining in the coupler 3, the controller 32 may also independently adjust or tune the drive current, i.e. the amplification, provided to each channel 15a and 15b of the gain mediums 2a and 2b, respectively, via control lines 17a and 17b, respectively. The tuning of the drive current may also act as or act in conjunction with the phase tuner 31.

An optical sensor may be provided between each of the first and second output ports 7 and 8 and the coupler 3 for detecting the power and/or wavelength of the first and second output beams. The optical sensor may include a monitor tap 19, ideally in the form of a directional coupler, provided on the waveguide between the second branch 22 and the first output port 7 and between the third branch 23 and the second output port 8 for separating off a small test portion, e.g. <5%, of the first and second output beams and delivering the test portion to a photodetector and/or wavelength detector 20, to provide a power and/or wavelength measure of back first and second output beams. The controller 32 receives the measure readings of the first and second output beams via control line 37, and may tune the phase tuner 31 and/or the drive currents to the channels 15a and 15b to equalize the power in the first and second output beams or adjust the power and phase to desired levels and/or tune the filters 41 to ensure the wavelengths are the desired wavelengths.

An optical filter 41 may be provided, between one or both of the gain mediums 2a and 2b and the optical coupler 3, for passing one or more selected optical wavelengths in the input optical signal and filtering out unwanted wavelengths, prior to amplification in the gain medium 2a and 2b and/or output the first and second output ports 7 and 8. Additional monitor ports 49a and 49b may be available for monitoring light, e.g. filtered out or unwanted light, going out of the filter 41.

First and second arms 71 and 72 of a modulator system 70 may be optically coupled to the first and second output ports 7 and 8, respectively, whereby the first and second output beams may be modulated to form a modulated output signal at modulator output 73. The first and second output beams may be further divided, e.g. by a series of splitters in arms 71 and 72, into any number, e.g. four or eight or even more, sub-sub-beams to accommodate modulation of coherent optical transmissions, e.g. amplitude and phase (IQ) of the light for both X and Y polarizations. The plurality of sub-sub-beams each may be modulated and then recombined to form a modulated output signal at modulator output 73. The modulator system 70 may be comprised of one or more Mach-Zehnder interferometer (MZI) modulators or a dual ring resonator modulators, as disclosed in U.S. Pat. No. 9,519,162 issued Dec. 13, 2016 to Ding et al; U.S. Pat. No. 9,559,779 issued Jan. 31, 2017 to Ding et al; and U.S. Pat. No. 9,787,405 issued Oct. 10, 2017 to Baehr-Jones et al, all of which are incorporated herein by reference. The modulator system 70 may be integrated onto the photonic integrated chip 11 (FIG. 2) or onto a separate photonic integrated chip 81, which is either flip chip bonded onto the photonic integrated chip 11 (FIG. 1) or connected to the photonic integrated circuit 11 (FIG. 3). Any combination of gain medium 2a and 2b and modulator system 70 assembly is possible.

Figure 4A:
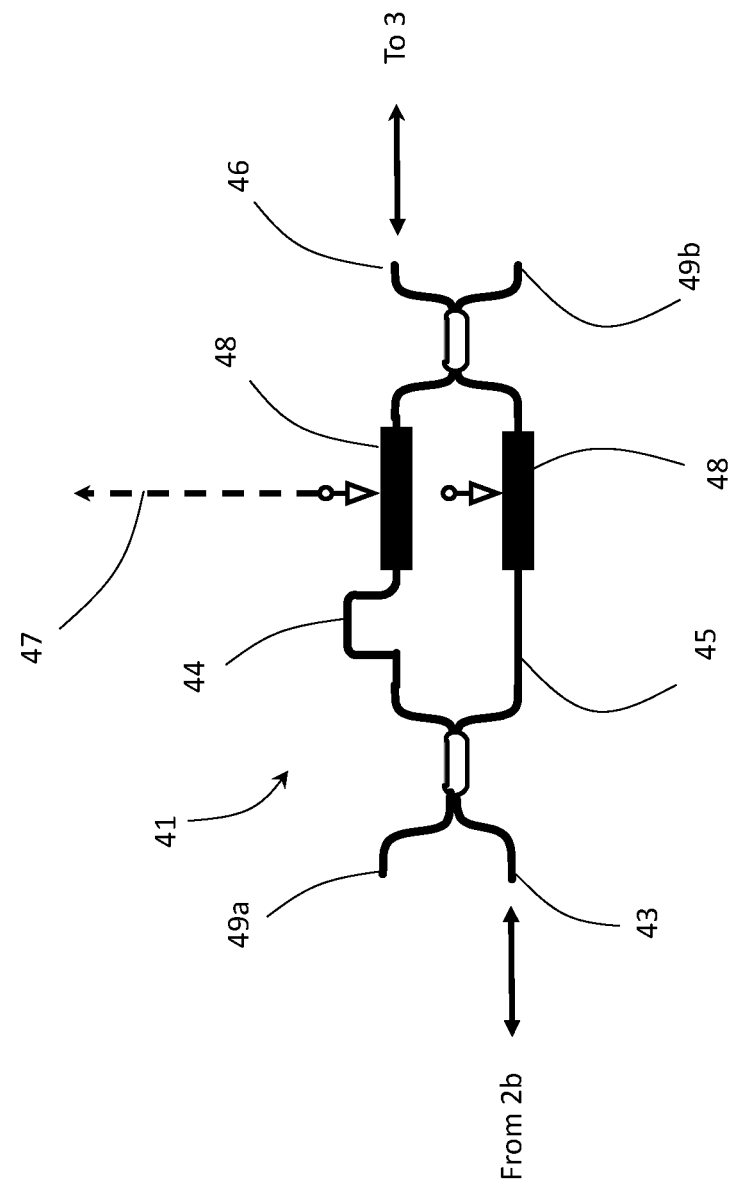
FIG. 4a is a schematic view of an embodiment of a filter in accordance with the embodiments of FIGS. 1 to 3.

With reference to FIG. 4a, the optical filter 41 may comprise an unbalanced Mach Zehnder interferometer including an input 43 optically coupled to one of the gain mediums 2a or 2b; first and second arms 44 and 45, and an output 46 optically coupled to the first branch 21 or the fourth branch 24. Phase tuners 48, e.g. heaters, may be provided in one or both arms 44 and 45 for tuning the passband of the filter 41, via control line 47.

Figure 4B:
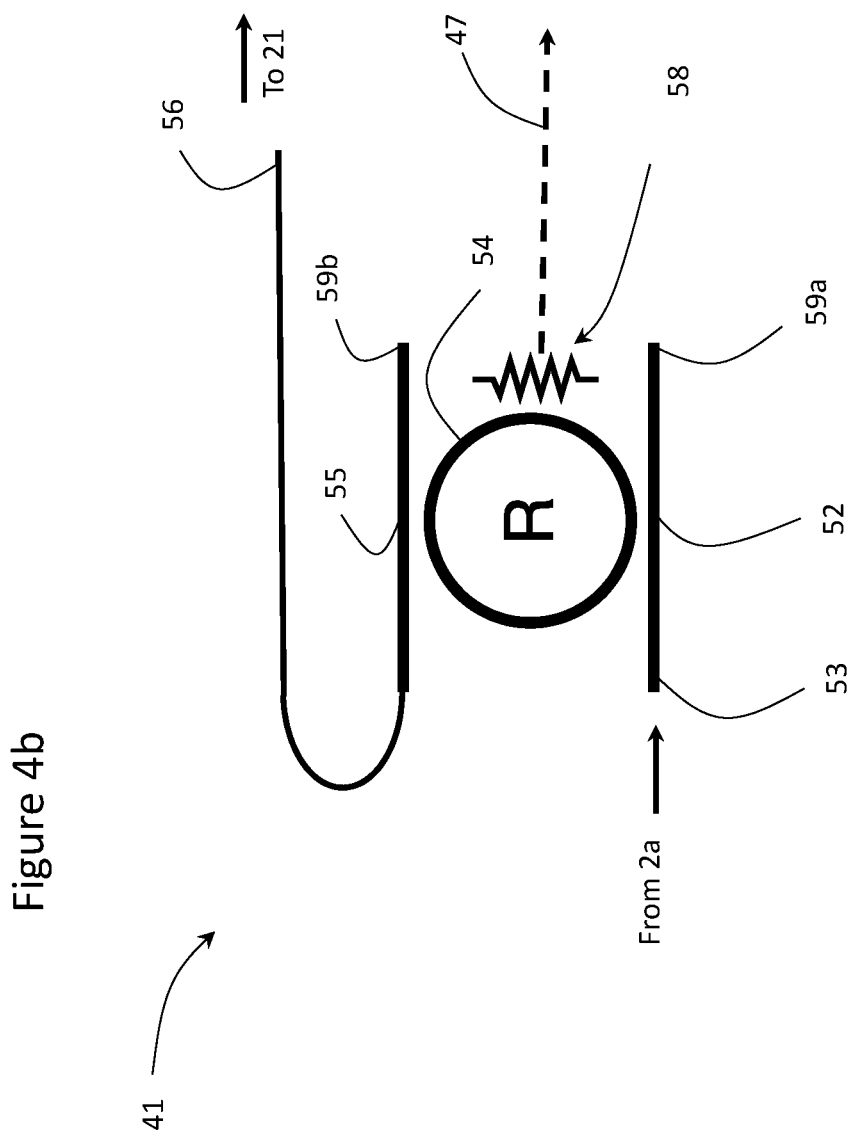
FIG. 4b is a schematic view of another embodiment of a filter in accordance with the embodiments of FIGS. 1 to 3.

With reference to FIG. 4b, the optical filter 41 may comprise a ring resonator including an input waveguide 52 with an input port 53 optically coupled to the gain medium 2a or 2b; at least one ring 54, and an output waveguide 55 with an output port 56 optically coupled to the first or fourth branch 21 or 24. Phase tuners 58, e.g. heaters, may be provided for tuning the passband of the filter 41, via control line 47. Additional monitor ports 59a and 59b may be available for monitoring light, e.g. filtered out or unwanted light, going into (59a) and going out of (59b) the filter 41. The optical filter may comprise a first ring resonator with a first FSR, i.e. radius and/or optical length, for passing a first set of periodic wavelengths, and a second ring resonator with a second FSR, i.e. radius and/or optical length, different from the first FSR for passing a second set of periodic wavelengths. The first and second ring resonators and combine to comprise the combined FSR with the selected wavelengths comprising only the overlapping wavelengths from the first and second sets of periodic wavelengths. Accordingly, using the Vernier effect, the combined FSR is much larger than either of the first and second FSR's.

Figure 5:
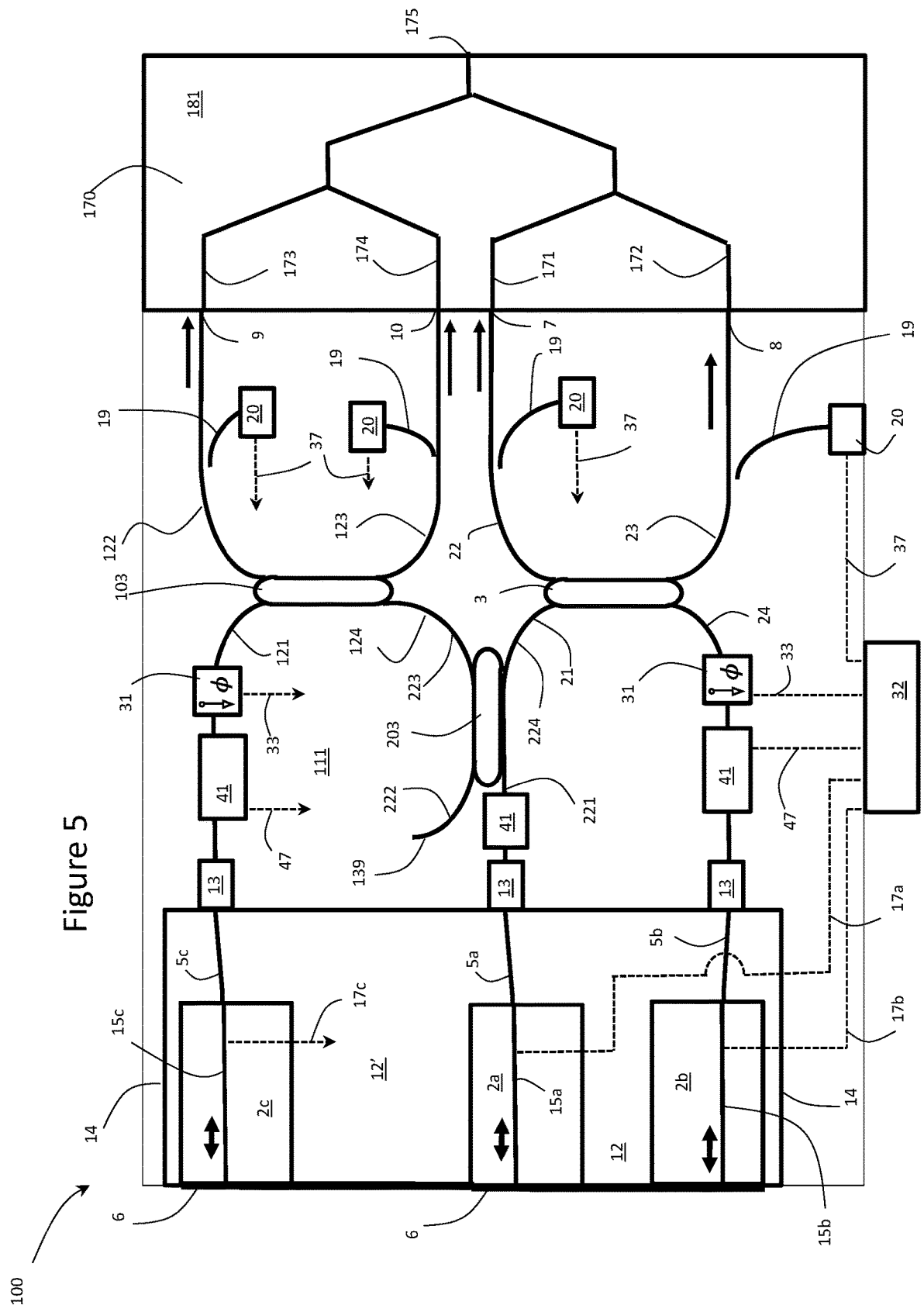
FIG. 5 is a schematic view of a laser in accordance with another embodiment of the present invention.

With reference to FIG. 5, in order to expand the number of output ports, a laser device 100 includes all of the elements of the laser device 1, 1' or 1", as hereinbefore disclosed, as well as a third gain medium 2c and a second optical coupler 103. The third gain medium 2c may be mounted on the same gain medium chip 112 as the first and second gain mediums 2a and 2b, and mounted on or connected to a photonic integrated chip 111, similar to photonic integrated circuit 11, as hereinbefore described with reference to FIGS. 1 and 3. Alternatively, the third gain medium 3c may be grown on the photonic integrated chip 111, as hereinbefore described with reference to FIG. 2.

The second optical coupler 103 may include a first port or branch 121 on one side optically coupled to the third gain medium 2c; a second port or branch 122 on the one side optically coupled to a third output port 9; a third port or branch 123 on an opposite side optically coupled to a fourth output port 10; and a fourth port or branch 124 on the opposite side optically coupled to the first gain medium 2a, via a crossover coupler 203. The second and third ports or branches 122 and 123 may be optically coupled to additional optical elements in the device layer of the photonic integrated chip 111 and/or to an edge of the photonic integrated chip 111. The terms optically coupled or coupled are intended to mean connected for the sake of transmitting light therebetween, typically directly connected or utilizing some form of waveguide structure, e.g. integrated waveguides in the device layer, with or without other intermediate optical elements therebetween.

The second optical coupler 103, e.g. a 2×2 directional 3 dB coupler (DC), may be connected to the first and third gain mediums 2a and 2c in order to split the laser light exiting the gain mediums 2a and 2c into two sub-beams, one sub-beam including a first percentage, e.g. 40%-60%, ideally 50%, of the power directed to the other gain medium 2a or 2c, and a second sub-beam including a second percentage, e.g. 40%-60%, ideally, 50% (or −3 dB) directed to the third or fourth output port 9 or 10. The coupling ratio may be optimized to trade for coupling losses in the device layer and amplification imbalances in the two gain mediums 2a and 2c. Accordingly, during operation light travelling from the first gain medium 2a is split by the coupler 103, and a first portion travels via the first branch 121 to the third gain medium 2c, and a second portion travels via the second branch 122 to the third output port 9 forming a third output beam. Similarly, light travelling from the third gain medium 2c is split by the coupler 103, and a first portion travels via the fourth branch 124 to the first gain medium 2a, and a second portion travels via the third branch 123 to the fourth output port 10 forming a fourth output beam. For the sake of simplicity, the term "beam" or "sub-beam" may refer to a propagating signal within a waveguide or fiber.

A third crossover coupler 203 includes a first port or branch 221 optically coupled to the first gain medium 2a; a second port or branch 222 optically coupled to, e.g. a monitor waveguide 139; a third port or branch 223 optically coupled to the fourth branch 124 of the second coupler 103; and a fourth port or branch 224 optically coupled to the first branch 21 of the first coupler 3. Accordingly, during operation light travelling from the first gain medium 2a is split by the crossover coupler 203, and a first portion travels via the third branch 223 to the second coupler 103 and to the third gain medium 2c or the third output port 9, and a second portion travels via the fourth branch 124 to the first coupler 3 and to the second gain medium 2b or the second output port 8. Similarly, light travelling from the first coupler 3 via the first branch 21 is split by the crossover coupler 203, and a first portion travels via the first branch 221 to the first gain medium 2a, and a second portion travels via the second branch 222 to the monitor waveguide 139.

The third gain medium 2c may comprise an angled I/O waveguide 5c, a channel waveguide 15c, and a control line 17c, as hereinbefore described. The third gain medium 2c may use the same reflector or reflectors 6 as the first and second gain mediums 2a and 2b or a separate reflector 6. Similarly, a mode coupler 13, a phase tuner 31 with control line 33, and a waveguide filter 41 with control line 47 may be disposed between the second coupler 103 and the third gain medium for reasons hereinbefore discussed with reference to FIGS. 1 to 3.

Optical sensors may be provided between each of the third and fourth output ports 9 and 10 and the second coupler 103 for detecting the power and/or wavelength of the third and fourth output beams, respectively. The optical sensor may include another monitor tap 19, ideally in the form of a directional coupler, provided on the waveguide between the second branch 122 and the third output port 9 and between the third branch 123 and the fourth output port 10 for separating off a small test portion, e.g. <5%, of the third and fourth output beams and delivering the test portion to another photodetector and/or wavelength detector 20, to provide a power and/or wavelength measure of back third and fourth output beams. The controller 32 receives the measure of the first and second output beams via control lines 37, and may tune the phase tuners 31 and/or the drive currents to the channels 15a, 15b and 15c to equalize the power in the first, second, third and fourth output beams or adjust the power and phase to desired levels, and/or tune the filters 41 to ensure the wavelengths are the desired wavelengths.

First, second, third and fourth arms 171 to 174 of a modulator system 170 may be optically coupled to the first, second, third and fourth output ports 7 to 10, respectively, whereby the first second, third and fourth output beams may be modulated to form a modulated output signal at modulator output 175. Any one or more of the first, second, third and fourth output beams may be further divided into two, four, eight or any number of sub-beams, e.g. by a plurality of splitters in arms 171 to 174, to accommodate modulation of coherent optical transmissions, e.g. amplitude and phase (IQ) of the light for both X and Y polarizations. The plurality of sub-beams each may be modulated and then recombined to form a modulated output signal at modulator output 175. The modulator system 170 may comprise Mach-Zehnder interferometer (MZI) modulators or a dual ring resonator modulators, as disclosed in U.S. Pat. No. 9,519,162 issued Dec. 13, 2016 to Ding et al; U.S. Pat. No. 9,559,779 issued Jan. 31, 2017 to Ding et al; and U.S. Pat. No. 9,787,405 issued Oct. 10, 2017 to Baehr-Jones et al, all of which are incorporated herein by reference. The modulator system 170 may be integrated onto the photonic integrated chip 111 (FIG. 2) or onto a separate photonic integrated chip 181, which is either flip chip bonded onto the photonic integrated chip 111 (FIG. 1) or connected to the photonic integrated circuit 111 (FIG. 3). Any combination of gain medium 2a and 2b and modulator system 170 assembly is possible.

Any number of additional gain mediums 2n, couplers 103, and crossover couplers 203 may be added to generate any number, e.g. 8 or 16, of a plurality of sub-beams. Accordingly, a method of generating a plurality of output optical sub-beams with a tunable laser comprises generating light in a plurality of gain mediums 2a-2n, transmitting the light between gain mediums via at least one respective coupler between each gain medium, and generating the plurality of output optical sub-beams with the couplers. The method may also include filtering the light to ensure the output optical sub-beams are all a desired wavelength. The method may also include adjusting the phase of the light to ensure all the output optical sub-beams have the same phase or a constant, predetermined or desired relative phase. The method may also include sampling each output optical sub-beam to measure the wavelength and/or phase for controlling the wavelength filtering and/or the phase adjustment. The method may also include dividing each output optical sub-beam into a plurality of sub-sub-beams, modulating each sub-sub-beam, and combing all of the sub-sub-beams at a single output.

Figure 6:
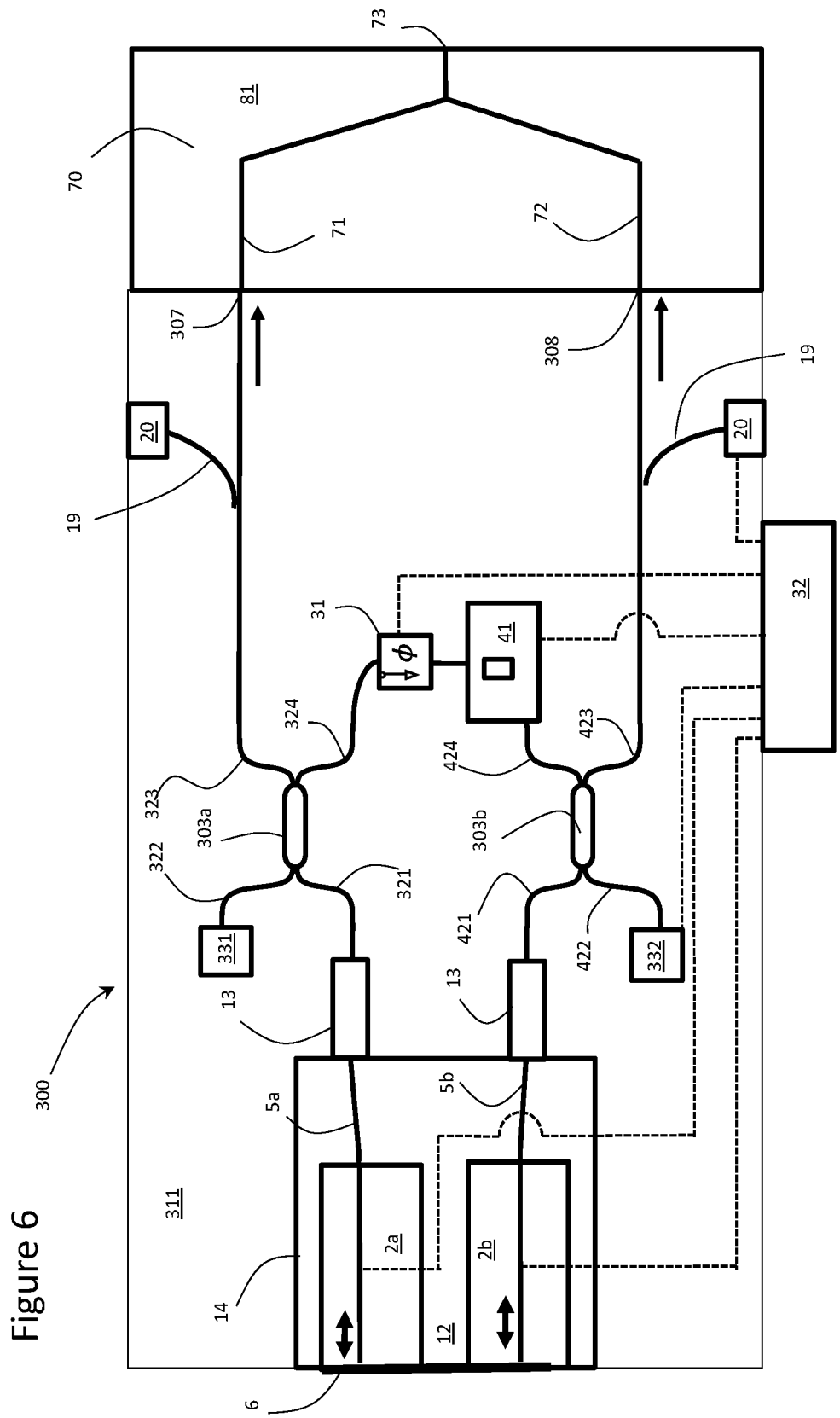
FIG. 6 is a schematic view of a laser in accordance with another embodiment of the present invention.

With reference to FIG. 6, a laser device 300, in accordance with another embodiment, includes a plurality of gain mediums, e.g. first and second gain mediums 2a and 2b, and a coupler system, e.g. the single coupler 3 may be replaced by first and second optical couplers 303a and 303b. The first and second gain mediums 2a and 2b may be mounted on a same gain medium chip 12, and mounted on or connected to a photonic integrated chip 311, similar to photonic integrated circuit 11, as hereinbefore described with reference to FIGS. 1 and 3. Alternatively, the first and second gain mediums 2a and 2b may be grown on the photonic integrated chip 311, as hereinbefore described with reference to FIG. 2.

The first optical coupler 303a may include a first port or branch 321 on one side optically coupled to the first gain medium 2a; a second port or branch 322 on the one side optically coupled to a first monitor port 331; a third port or branch 323 on an opposite side optically coupled to a first output port 307; and a fourth port or branch 324 on the opposite side optically coupled to the second optical coupler 303b. The third port or branch 323 may be optically coupled to additional optical elements in the device layer of the photonic integrated chip 311 and/or to an edge of the photonic integrated chip 311. The terms optically coupled or coupled are intended to mean connected for the sake of transmitting light therebetween, typically directly connected or utilizing some form of waveguide structure, e.g. integrated waveguides in the device layer, with or without other intermediate optical elements therebetween.

The first optical coupler 303a, e.g. a 2×2 directional 3 dB coupler (DC), may be connected to the first gain medium 2a in order to split the laser light exiting the first gain medium 2a into two sub-beams, one sub-beam including a first percentage, e.g. 40%-60%, ideally 50%, of the power directed to the second gain medium 2b via the second coupler 303b, and a second sub-beam including a second percentage, e.g. 40%-60%, ideally, 50% (or −3 dB) directed to the first output port 307. The coupling ratio may be optimized to trade for coupling losses in the device layer and amplification imbalances in the two gain mediums 2a and 2b. Accordingly, during operation light travelling from the first gain medium 2a is split by the first coupler 303a, and a first portion travels via the fourth branch 324 to the second gain medium 2b via the second coupler 303b, and a second portion travels via the third branch 323 to the first output port 307 forming a first output beam. Similarly, light travelling from the second gain medium 2b is split by the coupler 303a, and a first portion travels via the first branch 321 to the first gain medium 2a, and a second portion travels via the second branch 322 to the first monitor port 331.

The second optical coupler 303b may include a first port or branch 421 on one side optically coupled to the second gain medium 2b; a second port or branch 422 on the one side optically coupled to a second monitor port 332; a third port or branch 423 on an opposite side optically coupled to a second output port 308; and a fourth port or branch 424 on the opposite side optically coupled to the fourth branch 324 of the first optical coupler 303a. The third port or branch 423 may be optically coupled to additional optical elements in the device layer of the photonic integrated chip 311 and/or to an edge of the photonic integrated chip 311. The terms optically coupled or coupled are intended to mean connected for the sake of transmitting light therebetween, typically directly connected or utilizing some form of waveguide structure, e.g. integrated waveguides in the device layer, with or without other intermediate optical elements therebetween.

The second optical coupler 303b, e.g. a 2×2 directional 3 dB coupler (DC), may be connected to the second gain medium 2a in order to split the laser light exiting the second gain medium 2b into two sub-beams, one sub-beam including a first percentage, e.g. 40%-60%, ideally 50%, of the power directed to the first gain medium 2b via the first coupler 303a, and a second sub-beam including a second percentage, e.g. 40%-60%, ideally, 50% (or −3 dB) directed to the second output port 308. The coupling ratio may be optimized to trade for coupling losses in the device layer and amplification imbalances in the two gain mediums 2a and 2b. Accordingly, during operation light travelling from the second gain medium 2a is split by the second coupler 303b, and a first portion travels via the fourth branch 424 to the second gain medium 2b via the first coupler 303a, and a second portion travels via the third branch 423 to the second output port 308 forming a first output beam. Similarly, light travelling from the first gain medium 2a is split by the second coupler 303b, and a first portion travels via the first branch 421 to the second gain medium 2b, and a second portion travels via the second branch 422 to the second monitor port 332.

One or more I/O waveguides 5a and 5b, from the gain mediums 2a and 2b may be angled at a small acute angle to a normal from the output facet of the gain medium 2a and 2b, e.g. by 5° to 15°, ideally by 9°, and include an anti-reflection coating to reduce the back reflection at the output facet.

The reflectors 6 may be comprised of one or more reflective surfaces on the RSOAs, a reflective surface or coating in the pit 14 housing the first and second gain mediums 2a and 2b, or on a surface or coating of the photonic chip 311 or the gain medium chip 12, such as an outer edge of the photonic chip 311, as illustrated in FIG. 6. The reflector 6 may also comprise an alternate optical reflector, e.g. a grating, ring resonator, or some other wavelength filter element integrated into the photonic chip 311, the gain medium 12 or a separate reflector chip (not shown). Any combination of photonic chip 311, gain medium 2a/gain chip 12 arrangement, and reflective surface 6 arrangement is within the scope of the invention.

An optical mode coupler 13 may be provided for coupling the light between the gain mediums 2a and 2b, in particular from the gain medium chip 12, and the device layer on the photonic chip 311. Due to the large mode mismatch between the I/O waveguides 5a and 5b (or the waveguide channels 15a and 15b) from the gain mediums 2a and 2b and the waveguides in the device layer of the photonic chip 311, the optical mode coupler 13 may comprise an optical spot-size converter (SSC), which may be provided in the device layer of the photonic chip 311 to reduce the coupling loss between the gain mediums 2a and 2b and the photonic chip 311. Alternatively or in addition, the I/O waveguides 5a and 5b may include a tapering width and or height for expanding the mode reentering the gain mediums 2a and 2b and for contracting the mode leaving the gain medium chip 12.

One of more phase shifters or phase tuning sections 31 may be provided in or between the first and second optical couplers 303a and 303b or in between the first and second gain mediums 2a and 2b and the first and second optical couplers 303a and 303b, respectively. Each phase tuning section 31 may comprise any form of suitable phase tuning device, e.g. thermo-optic, electro-optic etc. The phase tuning section 31 may be controlled by an external controller 32, via control line 33, to control, e.g. the index of refraction or the effective optical length of the waveguide, i.e. the relative phase of the first and second output beams. The phase tuner, i.e. the phase tuning, may be provided by alternative means, e.g. in the couplers 303a and 303b or in the gain mediums 2a and 2b or the gain chip 12.

To ensure the amplitude of each of the output beams is substantially the same or at a desired level relative to each other when combining in the coupler 3, the controller 32 may also independently adjust or tune the drive current, i.e. the amplification, provided to each channel 15a and 15b of the gain mediums 2a and 2b, respectively, via control lines 17a and 17b, respectively. The tuning of the drive current may also act as or act in conjunction with the phase tuner 31.

An optical sensor may be provided between each of the first and second output ports 307 and 3088 and the first and second optical couplers 303a and 303b, respectively, for detecting the power and/or wavelength of the first and second output beams. The optical sensor may include a monitor tap 19, ideally in the form of a directional coupler, provided on the waveguide between the third branch 323 and the first output port 307 and between the third branch 423 and the second output port 308 for separating off a small test portion, e.g. <5%, of the first and second output beams and delivering the test portion to a photodetector and/or wavelength detector 20, to provide a power and/or wavelength measure of back first and second output beams. The controller 32 receives the measure of the first and second output beams via control line 37, and may tune the phase tuner 31 and/or the drive currents to the channels 15a and 15b to equalize the power in the first and second output beams or adjust the power and phase to desired levels and/or tune the filters 41 to ensure the wavelengths are the desired wavelengths.

An optical filter 41 may be provided, between the first and second optical couplers 303a and 303b, respectively, or between one or both of the gain mediums 2a and 2b and the corresponding optical coupler 303a or 303b, for passing one or more selected optical wavelengths in the input optical signal and filtering out unwanted wavelengths, prior to amplification in the gain medium 2a and 2b and/or output the first and second output ports 307 and 308. Additional monitor ports 49a and 49b or 59a and 59b may be available for monitoring light, e.g. filtered out or unwanted light, going out of the filter 41, as hereinbefore discussed with reference to FIGS. 4a and 4b.

First and second arms 71 and 72 of a modulator system 70 may be optically coupled to the first and second output ports 307 and 308, respectively, whereby the first and second output beams may be modulated to form a modulated output signal at modulator output 73. The first and second output beams may be further divided by a series of splitters in arms 71 and 72 into four or eight or even more sub-beams to accommodate modulation of coherent optical transmissions, e.g. amplitude and phase (IQ) of the light for both X and Y polarizations. The plurality of sub-beams each may be modulated and then recombined to form a modulated output signal at modulator output 73. The modulator system 70 may be comprised of one or more Mach-Zehnder interferometer (MZI) modulators or a dual ring resonator modulators, as disclosed in U.S. Pat. No. 9,519,162 issued Dec. 13, 2016 to Ding et al; U.S. Pat. No. 9,559,779 issued Jan. 31, 2017 to Ding et al; and U.S. Pat. No. 9,787,405 issued Oct. 10, 2017 to Baehr-Jones et al, all of which are incorporated herein by reference. The modulator system 70 may be integrated onto the photonic integrated chip 311 (FIG. 2) or onto a separate photonic integrated chip 81, which is either flip chip bonded onto the photonic integrated chip 311 (FIG. 1) or connected to the photonic integrated circuit 311 (FIG. 3). Any combination of gain medium 2a and 2b and modulator system 70 assembly is possible.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An external cavity laser device comprising:
    a first gain medium for generating light;
    a first reflector at one end of the first gain medium for reflecting light back through the first gain medium;
    a second gain medium for generating light;
    a second reflector at one end of the second gain medium for reflecting light back through the second gain medium; and
    a first coupler including a first input/output port optically coupled to the first gain medium, a second input/output port optically coupled to the second gain medium, and first and second output ports for outputting laser light at a selected wavelength range;
    whereby light travelling from the first gain medium via the first input/output port is split into first and second portions by the first coupler, with the first portion passing to the second gain medium, and the second portion passing to the first output port as a first output beam, and whereby light travelling from the second gain medium via the second input/output port is split into third and fourth portions by the first coupler, with the third portion passing to the first gain medium, and the fourth portion passing to the second output port as a second output beam.

2. The device according to claim 1, further comprising an optical filter optically coupled between the first gain medium and the coupler for passing light at the selected wavelength range, and rejecting light other than the selected wavelength range.

3. The device according to claim 2, wherein the optical filter comprises a tunable filter for tuning the selected wavelength range.

4. The device according to claim 1, further comprising a first phase shifter configured for adjusting the phase of the light to ensure that the first and second output beams have a desired relative phase.

5. The device according to claim 1, further comprising a controller configured for independently tuning an amount of gain provided by the first and second gain mediums for adjusting a power level of both the first and second output beams.

6. The device according to claim 5, further comprising a first optical sensor optically coupled to the first output port for determining a power level of the first output beam; and a second optical sensor optically coupled to the second output port for determining a power level of the second output beam;
    wherein the controller is configured for tuning the amount of gain of the first and second gain mediums in response to the power levels of the first and second output beams.

7. The device according to claim 6, further comprising a wavelength sensor for obtaining wavelength readings of the first and second output beams.

8. The device according to claim 7, further comprising an optical filter optically coupled between the first gain medium and the coupler for passing light at the selected wavelength range, and rejecting light other than the selected wavelength range;
    wherein the controller is also configured for tuning the optical filter in response to the wavelength readings from the optical filter.

9. The device according to claim 1, further comprising a photonic integrated chip for supporting the coupler; and a gain medium chip for supporting at least one of the first and second gain mediums.

10. The device according to claim 9, wherein the gain medium chip is mounted on the photonic integrated chip.

11. The device according to claim 1, further comprising a photonic integrated chip for supporting the coupler; wherein the photonic integrated chip includes a pit for receiving the first gain medium.

12. The device according to claim 1, further comprising:
a third gain medium for generating light;
a third reflector at one end of the third gain medium for reflecting light back through the third gain medium;
a second coupler including a third input/output port optically coupled to the first gain medium, a fourth input/output port optically coupled to the second input/output of the first coupler, and a fifth input/output port optically coupled to the third gain medium; and
a third coupler including a sixth input/output port optically coupled to the third gain medium, a seventh input/output port optically coupled to the first gain medium via the fifth input/output port and the third input/output port of the second coupler, and third and fourth output ports for outputting third and fourth output beams at the selected wavelength.

13. The device according to claim 1, further comprising:
a modulator system optically coupled to the first and second output ports for modulating the first and second output beams into a modulated output signal.

14. The device according to claim 13, further comprising:
a plurality of splitters for splitting each of the first and second output beams into four sub-beams;
wherein the modulator system comprises a coherent modulator system for modulating in-phase and quadrature (IQ) components for two states of polarization (XY).

* * * * *